US012800088B2

(12) United States Patent
Bang et al.

(10) Patent No.: US 12,800,088 B2
(45) Date of Patent: Nov. 17, 2026

(54) FLEXIBLE DISPLAY DEVICE

(71) Applicant: LG DISPLAY CO., LTD., Seoul (KR)

(72) Inventors: Young Kyu Bang, Paju-si (KR); Chang Hee Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 206 days.

(21) Appl. No.: 18/789,271

(22) Filed: Jul. 30, 2024

(65) Prior Publication Data

US 2025/0216020 A1 Jul. 3, 2025

(30) Foreign Application Priority Data

Dec. 28, 2023 (KR) ........................ 10-2023-0194775

(51) Int. Cl.
*G06F 1/16* (2006.01)
*F16M 11/04* (2006.01)
*H05K 5/03* (2006.01)
*F16H 19/04* (2006.01)

(52) U.S. Cl.
CPC ......... *F16M 11/048* (2013.01); *G06F 1/1652* (2013.01); *H05K 5/03* (2013.01); *F16H 19/04* (2013.01); *F16M 2200/06* (2013.01)

(58) Field of Classification Search
CPC .. G06F 1/1652; F16M 11/048; H02K 7/1166; G09G 3/03; G09G 3/035
See application file for complete search history.

(56) References Cited

U.S. PATENT DOCUMENTS

| | | | | |
|---|---|---|---|---|
| 9,123,290 B1 * | 9/2015 | Cho | G06F 1/1652 | |
| 11,798,439 B2 * | 10/2023 | Oh | G09F 9/35 | |
| 12,085,995 B2 * | 9/2024 | Magi | G06F 1/1616 | |
| 2014/0376163 A1 * | 12/2014 | Song | G09F 9/301 | 361/679.01 |
| 2015/0035812 A1 * | 2/2015 | Shin | G06F 1/1601 | 345/204 |
| 2015/0192952 A1 * | 7/2015 | Jung | G06F 1/20 | 361/747 |
| 2015/0296641 A1 * | 10/2015 | Song | F16M 11/18 | 361/679.01 |
| 2016/0040764 A1 * | 2/2016 | Park | G09F 9/301 | 361/679.01 |
| 2017/0347466 A1 * | 11/2017 | Kang | G09G 3/20 | |
| 2018/0011518 A1 * | 1/2018 | Choi | H04N 5/64 | |
| 2022/0351649 A1 * | 11/2022 | Park | F16M 11/08 | |
| 2022/0358865 A1 * | 11/2022 | Yeo | G06F 1/16 | |
| 2022/0366816 A1 * | 11/2022 | Oh | F03G 7/064 | |
| 2024/0019893 A1 * | 1/2024 | Hwang | G06F 1/1601 | |

* cited by examiner

*Primary Examiner* — Anthony Q Edwards
(74) *Attorney, Agent, or Firm* — Birch, Stewart, Kolasch & Birch, LLP

(57) ABSTRACT

Provided is a flexible display device including a back cover configured to support a rear surface of a display panel, a pair of arm plates disposed to face each other and having a portion of an end portion thereof fixed to the back cover, a driving assembly connected between the pair of arm plates, and configured to slide the arm plate in a length direction to change a curvature of the back cover and the display panel, and a cover part disposed on a rear surface of the back cover and configured to cover the driving assembly to shield noise generated from the driving assembly.

22 Claims, 13 Drawing Sheets

FLEXIBLE DISPLAY DEVICE

CROSS-REFERENCE TO RELATED APPLICATION

This application claims priority to Korean Patent Application No. 10-2023-0194775, filed on Dec. 28, 2023, the entire contents of which is hereby expressly incorporated by reference into the present application.

BACKGROUND

Field

Embodiments of the disclosure are related to a flexible display device.

Discussion of Related Art

With the recent development of various portable electronic devices, e.g., mobile communication terminals and laptop computers, display devices, visual information and transfer of such information are becoming increasingly significant.

Recently, flexible display devices which are manufactured of a flexible material, such as plastic, rather than a non-flexible material, e.g., glass substrate, to be bendable like paper, but without deterioration of display performance, are rapidly attracting attention as a next-generation display device. These flexible display devices have advantages in space utilization, aesthetics, and design, and can be adopted in various applications.

Meanwhile, the curvature of the flexible display device can be changed through a driving assembly coupled to the rear surface of the display panel that implements an image. However, noise from a motor or gears included in the driving assembly during driving can impair use satisfaction.

SUMMARY OF THE DISCLOSURE

Embodiments of the disclosure can provide a flexible display device capable of reducing noise generated when changing the curvature of the display panel by including a cover for shielding the noise generated in the driving assembly.

Embodiments of the disclosure can provide a flexible display device capable of reducing noise by forming no gap between the back cover and the arm plate when changing the curvature of the back cover by including a variable plate that is disposed in the cover of the driving assembly to move together along the moving direction of the arm plate when changing the curvature of the back cover.

Embodiments of the disclosure can prevent a slip that causes an end portion of the arm plate to escape off the back cover when operating the driving assembly by providing an anti-loosening part for increasing the coupling force with the arm plate to the fixing assembly for fixing the end portion of the arm plate to the back cover.

Embodiments of the disclosure can provide a display device capable of changing the curvature of the display panel with low power through a high-efficiency driving assembly.

Embodiments of the disclosure can provide a flexible display device comprising a back cover supporting a rear surface of a display panel, a pair of arm plates disposed to face each other and having an outer portion thereof fixed to the back cover, a driving assembly connected between the pair of arm plates, and sliding the arm plate in a length direction to change a curvature of the back cover and the display panel, and a cover part disposed on a rear surface of the back cover and covering the driving assembly to shield noise generated from the driving assembly.

According to embodiments of the disclosure, there can be provided a flexible display device capable of reducing noise generated when changing the curvature of the back cover and the display panel by including a cover for shielding the noise generated in the driving assembly.

According to embodiments of the disclosure, there can be provided a flexible display device capable of reducing noise by forming no gap between the back cover and the arm plate when changing the curvature of the back cover by including a variable plate that is disposed in the cover of the driving assembly to move together along the moving direction of the arm plate when changing the curvature of the back cover.

According to embodiments of the disclosure, it is possible to prevent a slip that can cause an end portion of the arm plate to escape off the back cover when operating the driving assembly by providing an anti-loosening part for increasing the coupling force with the arm plate to the fixing assembly for fixing the end portion of the arm plate to the back cover.

According to embodiments of the disclosure, there can be provided a display device capable of changing the curvature of the display panel with low power through a high-efficiency driving assembly.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
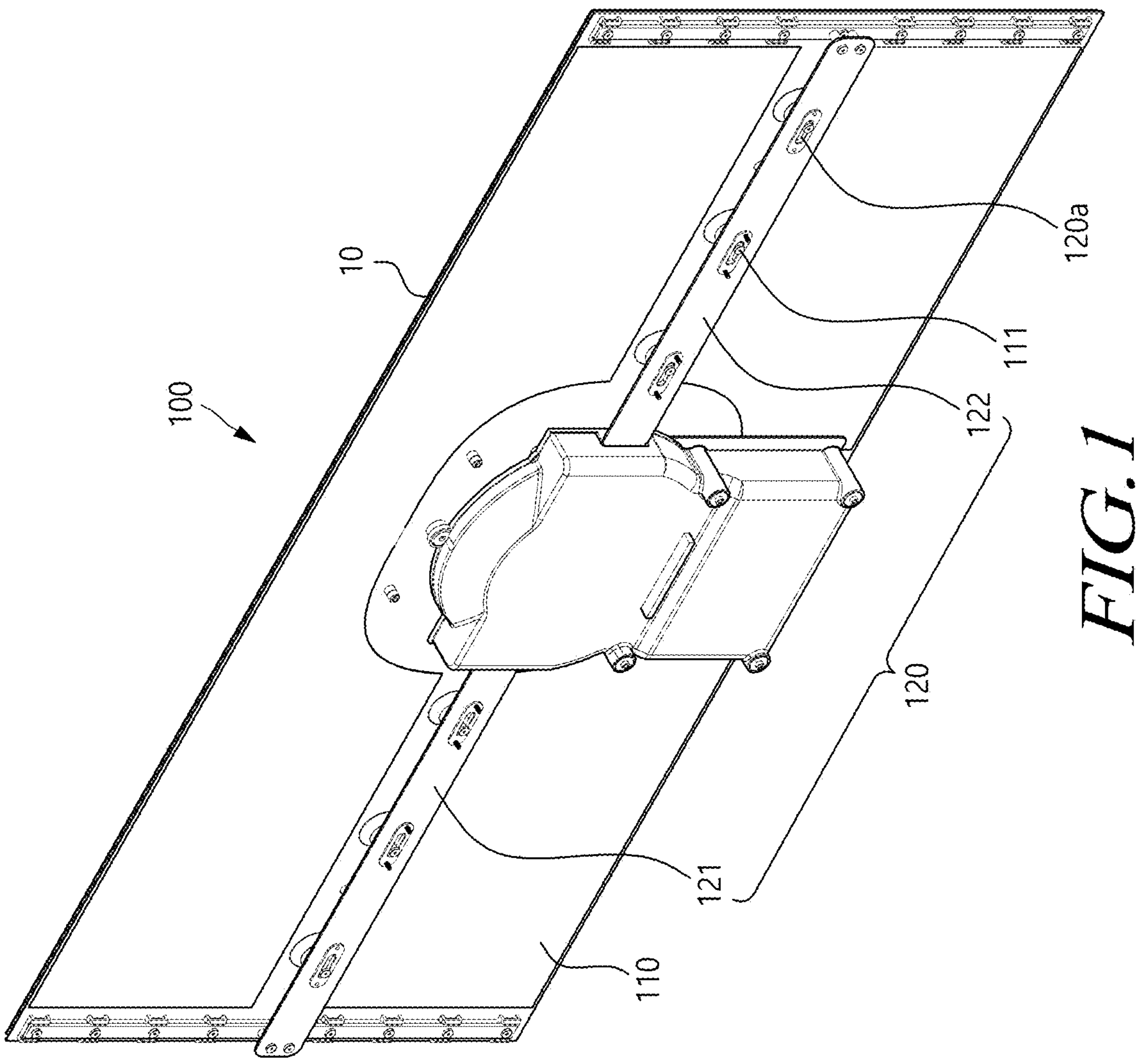
FIG. 1 is a perspective view illustrating a flexible display device according to an embodiment of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description can make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "can" fully encompasses all the meanings and coverages of the term "may".

Hereinafter, various embodiments of the disclosure are described in detail with reference to the accompanying drawings.

Figure 2:
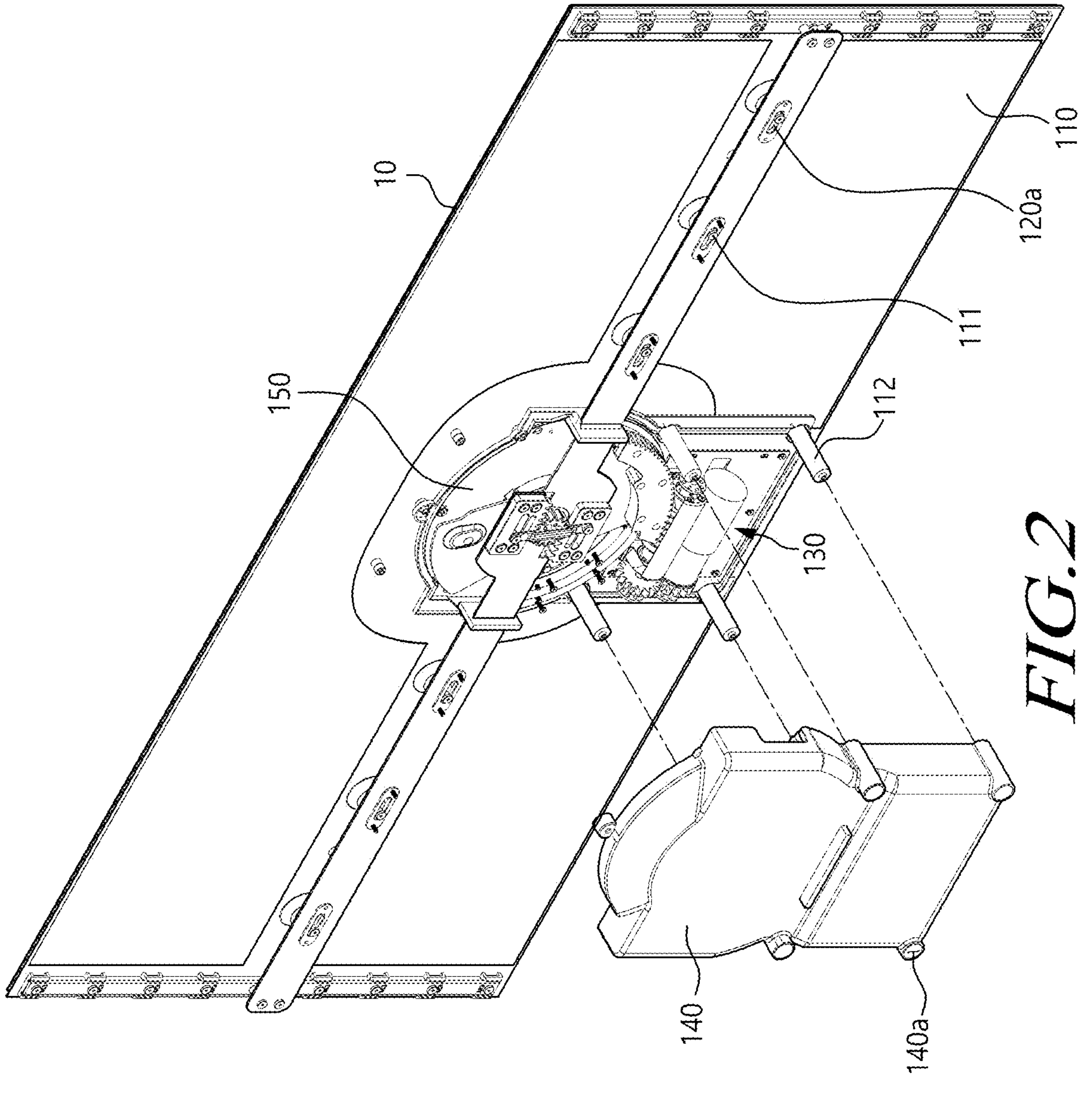
FIG. 2 is a perspective view illustrating a state in which a cover part is separated from the flexible display device of FIG. 1.

FIG. 1 is a perspective view illustrating a flexible display device according to an embodiment of the disclosure, and FIG. 2 is a perspective view illustrating a state in which a cover part is separated from the flexible display device of FIG. 1.

Referring to FIGS. 1 to 2, the flexible display device 100 can include a back cover 110, an arm plate 120, a driving assembly 130, and a cover 140.

Hereinafter, in embodiments of the disclosure, a side where the display panel 10 is positioned is referred to as a front side, and a side where the back cover 110 is positioned is referred to as a rear side, in the drawings.

The back cover 110 can cover and protect the rear surface of the display panel 10, and can support the rear surface of the display panel 10. As described above, as the back cover 110 is provided on the rear surface of the display panel 10, it is possible to prevent accidents such as foreign substances penetrating into the display panel 10 or damage to the display panel 10 due to an external impact.

The display panel 10 implements an image and can be formed of an organic light emitting display panel. However, the configuration of the display panel 10 is not limited to the example, and can be variously configured such as a liquid crystal display panel and a plasma display panel.

The curvature of the display panel 10 can be changed together with the back cover 110 by the arm plate 120, and can be set from a flat mode to a curved mode or from the curved mode to the flat mode according to the radius of curvature.

A pair of arm plates 120 can be formed and disposed to face each other, and a portion of an end can be fixed to the back cover 110. For example, the arm plates 120 can be elongated in the length direction of the back cover 110, and can include a first arm plate 121 disposed on the left side and a second arm plate 122 disposed on the right side. The respective end portions of the arm plates 120 can be coupled through the nut member 20 and the bolt member 30, which are both described below.

The arm plate 120 can be formed of a metal material such as an aluminum alloy or stainless steel having high rigidity to bend the back cover 110, and can be elastically deformed and restored with a predetermined curvature.

The driving assembly 130 can be connected between the pair of arm plates 120, can slide the arm plates 120 in the length direction, and can change the curvature of the back cover 110 and the display panel 10. In other words, the driving assembly 130 can be connected between the first arm plate 121 and the second arm plate 122 to slide the first arm plate 121 and the second arm plate 122 in opposite directions. In this case, since the end portions of the first arm plate 121 and the second arm plate 122 are fixed on the back cover 110, when the driving assembly 130 is driven, the end portions of the first arm plate 121 and the second arm plate 122 can be bent on the back cover 110 and the curvature can be changed. As the curvature of the first arm plate 121 and the second arm plate 122 is changed, the back cover 110 and the display panel 10 coupled to the first arm plate 121 and the second arm plate 122 can also be bent while changing the curvature.

The driving assembly 130 can be coupled to a bracket 150 detachably fixed to the rear surface of the back cover 110. For example, one surface of the bracket 150 can be detachably fixed to the rear surface of the back cover 110, and the driving assembly 130 can be coupled to the other surface of the bracket 150. As described above, as the driving assembly 130 is coupled to the bracket 150 detachably formed on the back cover 110, only the bracket 150 needs to be separated and repaired when the driving assembly 130 fails or parts are replaced, thereby increasing the ease and efficiency of maintenance.

The cover 140 can be disposed on the rear surface of the back cover 110 and can cover the driving assembly 130 to shield noise generated from the driving assembly 130. Accordingly, when the display panel 10 is set from the flat mode to the curved mode or from the curved mode to the flat mode, the noise generated from the driving assembly 130 can be reduced to enhance satisfaction during use.

The cover part 140 can be coupled onto the bracket 150 through a fastening member such as a bolt. For example, a plurality of coupling protrusions 112 can be provided on the rear surface of the back cover 110, and a coupling hole **140*a* into which the coupling protrusion 112 is inserted can be provided in the cover 140. Specifically, the coupling protrusion 112 can be formed in a hollow cylindrical shape having a threaded inner circumferential surface, and a plurality of coupling protrusions 112 can be provided to be spaced apart from each other on the upper and lower portions of the bracket 150. Accordingly, in a state in which the coupling protrusion 112 is inserted into the coupling hole 140***a* of the cover 140, when a fastening member such as a bolt is inserted into the hollow of the coupling protrusion 112 and fastened, the cover 140 can be stably guided and fixed on the back cover 110.

According to the present embodiment, the arm plate 120 can include a plurality of guide holes 120*a* elongated in the length direction, and the back cover 110 can include a plurality of guide members 111 protruding from the rear surface and moving along the guide holes 120*a*. Due to this configuration, when the driving assembly 130 is operated, the guide member 111 moves along the guide hole 120*a*. In this case, since the end portion of the arm plate 120 is constrained by the back cover 110, when the guide member 111 moves along the guide hole 120*a*, the arm plate 120 can be bent to change the curvature of the back cover 110 and the display panel 10.

Meanwhile, the curvature of the back cover 110 and the display panel 10 can vary according to a length of the guide hole 120*a*. In other words, as the length of the guide hole 120*a* increases, the back cover 110 and the display panel 10 can be more bent, so that the curvature can increase, and as the length of the guide hole 120*a* decreases, the back cover 110 and the display panel 10 can be less bent, so that the curvature can decrease.

Figure 3:
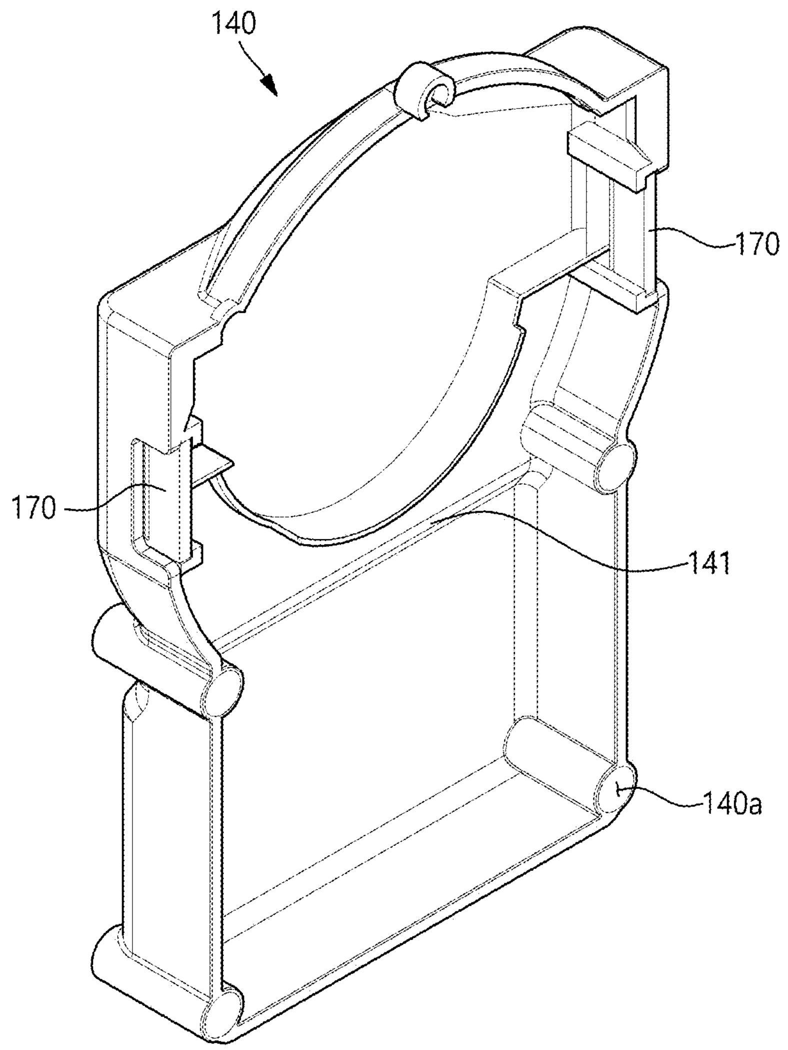
FIG. 3 is a perspective view illustrating a cover part according to an embodiment of the disclosure.

FIG. 3 is a perspective view illustrating a cover part according to an embodiment of the disclosure.

Referring to FIG. 3, the cover 140 can include a rib 141 formed to protrude from an inner surface of the cover 140 to surround a lower portion of the driving assembly 130. Accordingly, since the lower side of the driving assembly 130 is covered once more by the rib 141, noise generated from the driving assembly 130 can be more effectively blocked.

Figure 4:
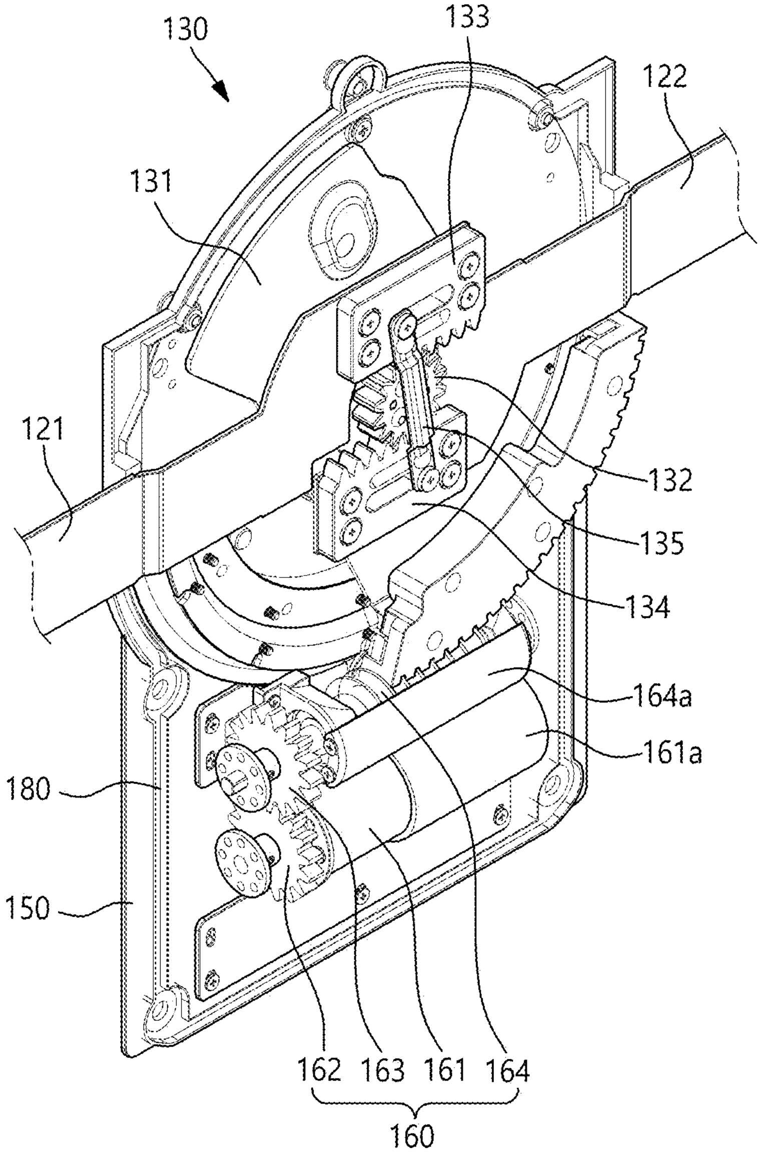
FIG. 4 is a view illustrating a driving assembly according to an embodiment of the disclosure.
Figure 5:
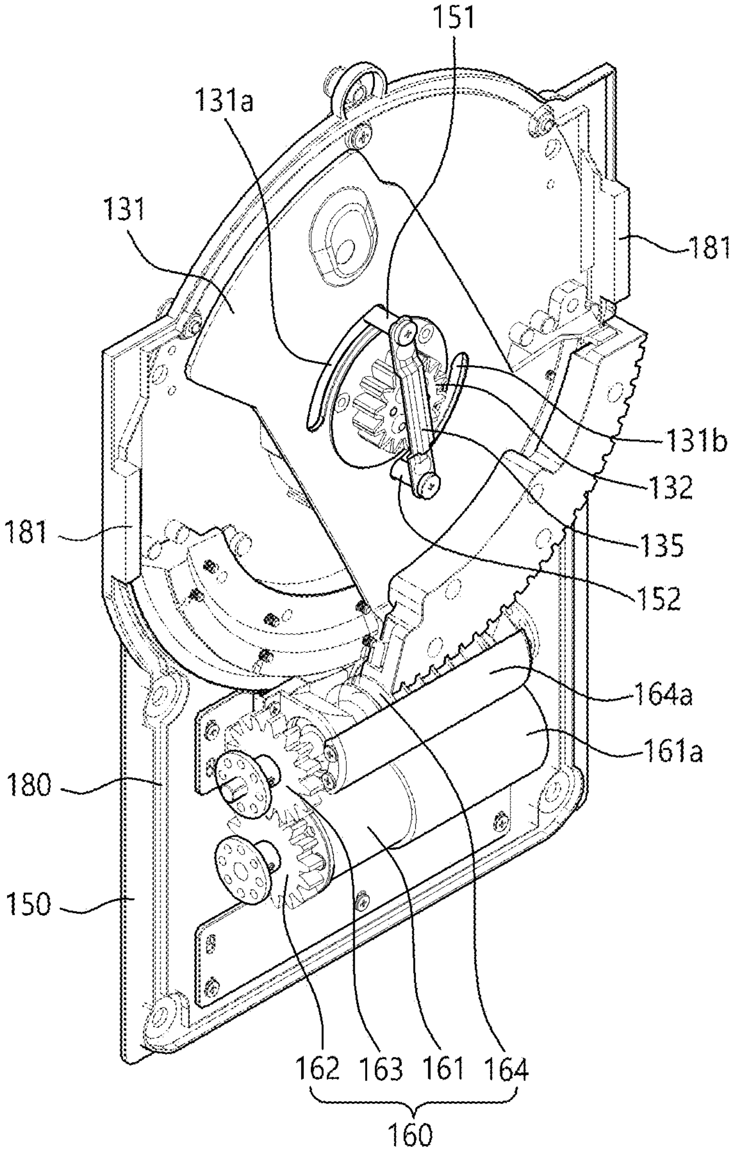
FIG. 5 is a view illustrating a portion of the driving assembly of FIG. 4.
Figure 6:
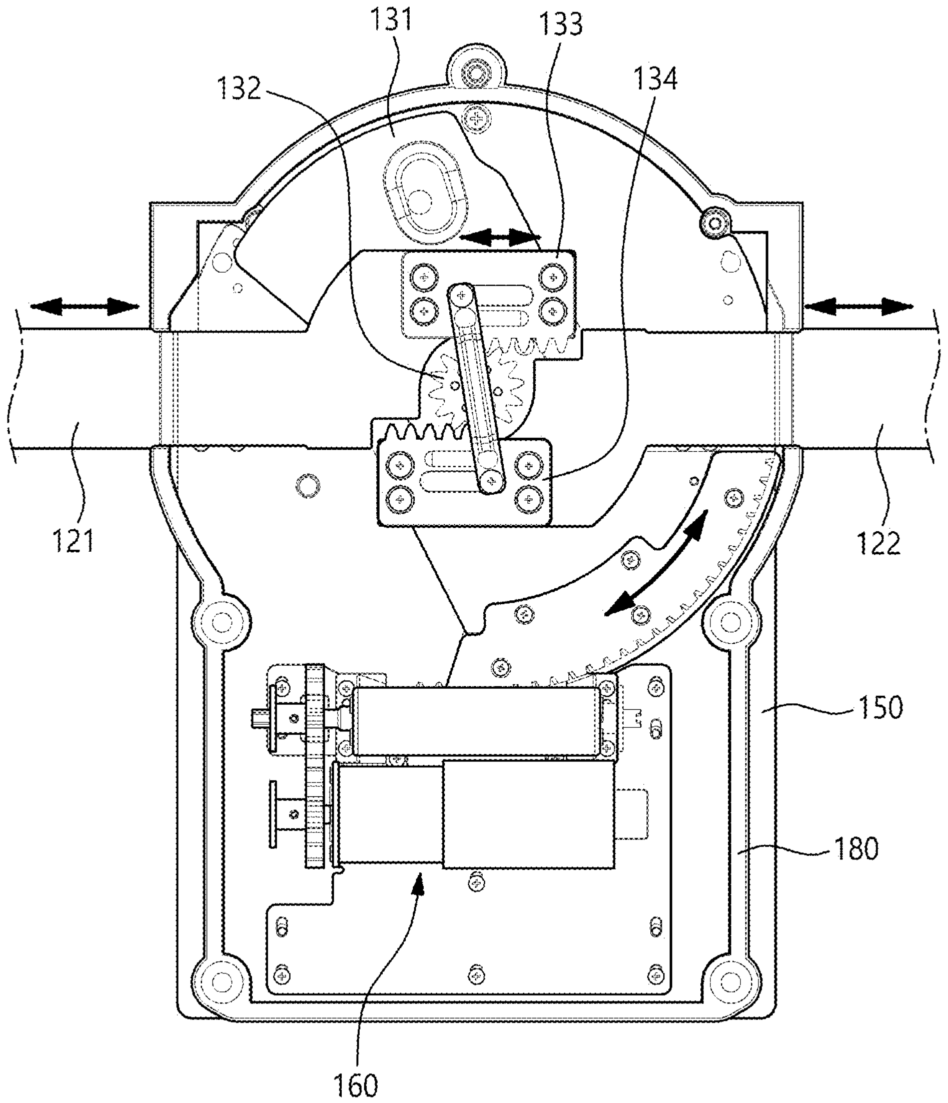
FIG. 6 is a view illustrating a moving direction of the driving assembly of FIG. 4.

FIG. 4 is a view illustrating a driving assembly according to an embodiment of the disclosure, FIG. 5 is a view illustrating a portion of the driving assembly of FIG. 4, and FIG. 6 is a view illustrating a moving direction of the driving assembly of FIG. 4.

Referring to FIGS. 4 to 6, the driving assembly 130 can include a wheel member 131, a pinion gear 132, a first rack gear 133, and a second rack gear 134.

The wheel member 131 can be rotatably connected to the rear surface of the back cover 110. For example, the wheel member 131 can be provided as a worm wheel gear and can be disposed in the center of the rear surface of the back cover 110. Specifically, the wheel member 131 can be guided for its movement by a first guide protrusion 151 and a second guide protrusion 152 that protrude in one direction from the rear surface of the bracket 150 and are disposed on the upper side and the lower side, respectively, with respect to the rotation axis of the wheel member 131.

For example, the first guide slot 131*a* and the second guide slot 131*b* can have an arc-shaped first guide slot 131*a* and a second guide slot 131*b* on the upper side and the lower side, respectively, of the wheel member 131 with respect to the rotation axis.

Accordingly, when the first guide protrusion 151 is inserted into the first guide slot 131*a* and the second guide protrusion 152 is inserted into the second guide slot 131*b*, the wheel member 131 can rotate along the first guide slot 131*a* and the second guide slot 131*b* while being supported by the first guide protrusion 151 and the second guide protrusion 152. In this case, in order to prevent the wheel member 131 from escaping from the first guide protrusion 151 and the second guide protrusion 152 when the wheel member 131 rotates, a connecting member 135 can be coupled between the end portion of the first guide protrusion 151 and the end portion of the second guide protrusion 152.

The pinion gear 132 can be fixed to the rotating shaft of the wheel member 131 to interlock with the wheel member 131. In other words, when the wheel member 131 rotates clockwise, the pinion gear 132 can also rotate clockwise, and when the wheel member 131 rotates counterclockwise, the pinion gear 132 can also rotate counterclockwise.

One surface of the first rack gear 133 can be fixed to one of the arm plates 120, and a lower portion thereof can be engaged with one side of the pinion gear 132 to linearly move when the pinion gear 132 rotates. For example, the rear surface of the first rack gear 133 can be fixed to the first arm plate 121, and the lower portion thereof can be engaged with the upper portion of the pinion gear 132, so that it can linearly move to the left or right according to a rotation direction of the pinion gear 132.

One surface of the second rack gear 134 can be fixed to the rest of the arm plate 120, and an upper portion thereof can be engaged with the other side of the pinion gear 132 so that it can linearly move in a direction opposite to that of the first rack gear 133 when the pinion gear 132 rotates. For example, the rear surface of the second rack gear 134 can be fixed to the second arm plate 122, and the upper portion thereof can be engaged with the lower portion of the pinion gear 132, so that it can linearly move to the left or right according to the rotation direction of the pinion gear 132.

For example, when the pinion gear 132 rotates clockwise, the first rack gear 133 disposed above the pinion gear 132 can move in the right direction, and the second rack gear 134 disposed below the pinion gear 132 can move in the left direction. In this case, since the first arm plate 121 is connected to the first rack gear 133 and the second arm plate 122 is connected to the second rack gear 134, the first arm plate 121 can move in the right direction in conjunction with the first rack gear 133, and the second arm plate 122 can move in the left direction in conjunction with the second rack gear 134.

The driving assembly 130 can be driven by receiving power from a power transmission unit 160. For example, the power transmission unit 160 can rotate the worm wheel member 131 on the rear surface of the back cover 110, and can include a rotary actuator 161, a first connecting gear 162, a second connecting gear 163, and a worm gear 164.

The rotary actuator 161 can be rotatably coupled to the rear surface of the back cover 110. For example, the rotary actuator 161 can be formed of a rotary motor, and a rotary actuator cover part 161*a* for shielding noise generated when the rotary actuator 161 is driven can be disposed outside.

The first connecting gear 162 can be coupled to the rotating shaft of the rotary actuator 161. Accordingly, when the rotary actuator 161 is driven, the first connecting gear 162 can receive power from the rotary actuator 161 and rotate in the same direction as the rotary actuator 161.

The second connecting gear 163 can be engaged with the first connecting gear 162 and can rotate in conjunction with the first connecting gear 162. For example, the second connecting gear 163 can be disposed above the first connecting gear 162 and engaged with the first connecting gear 162, and can rotate in the same direction as the first connecting gear 162 by receiving power from the first connecting gear 162.

A rotating shaft of the worm gear 164 can be coupled to the second connecting gear 163, and a worm engaged with the worm wheel member 131 can be formed on an outer circumferential surface of the worm gear 164. Accordingly, the worm gear 164 can receive power from the rotary actuator 161 through the first connecting gear 162 and the second connecting gear 163 to rotate in the same direction as the rotary actuator 161, and can rotate the worm wheel member 131 positioned on the upper portion by the worm formed on the outer circumferential surface. In this case, the worm gear cover part 164*a* for shielding noise generated during driving can be disposed on an outer circumferential surface of the worm gear 164.

Figure 7:
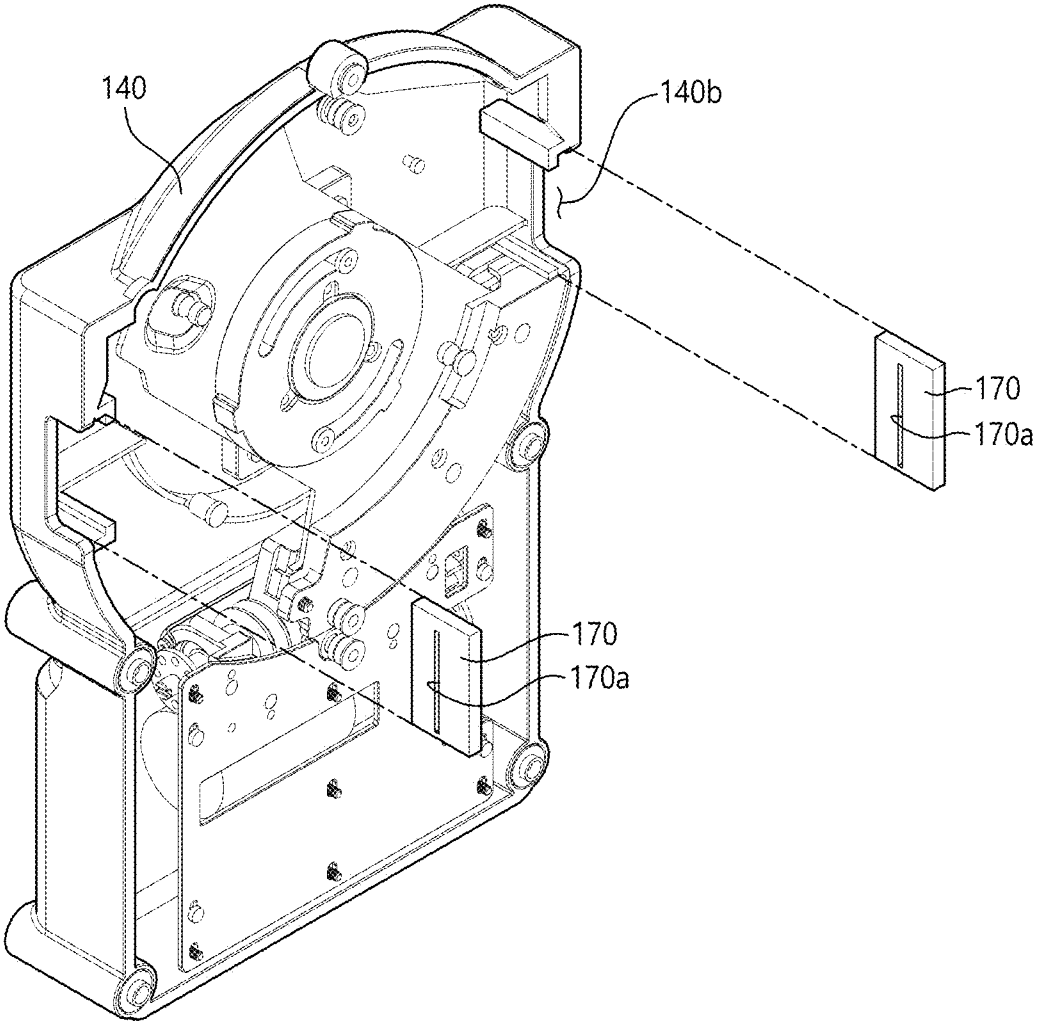
FIG. 7 is a view illustrating a state in which a variable plate is separated from a cover part according to an embodiment of the disclosure.
Figure 8:
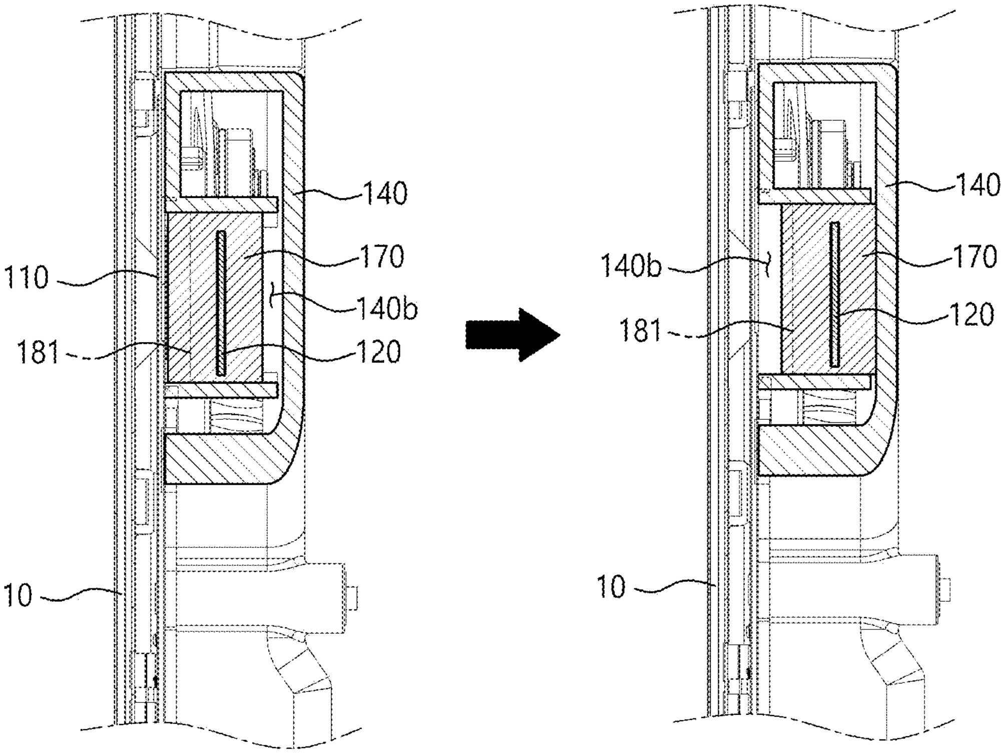
FIG. 8 is a view illustrating an operation of the variable plate of FIG. 7.

FIG. 7 is a view illustrating a state in which a variable plate is separated from a cover part according to an embodiment of the disclosure, and FIG. 8 is a view illustrating an operation of the variable plate of FIG. 7.

Referring to FIGS. 7 to 8, the flexible display device 100 can include a variable plate 170 formed to support an inner portion of the arm plate 120 and to be linearly movable in a direction perpendicular to the moving direction of the arm plate 120 within the cover 140.

For example, the variable plate 170 can have a through hole 170*a* through which the arm plate 120 passes, and the cover part 140 can have a guide groove 140*b* recessed in a direction perpendicular to the moving direction of the arm plate 120, in a surface facing the back cover 110. Accordingly, when a driving force of the driving assembly 130 is transmitted to the arm plate 120, the variable plate 170 connected to the arm plate 120 can linearly move in the guide groove 140*b* when the curvature is changed.

As described above, as the variable plate 170 interlocking with the arm plate 120 is provided in the cover 140, it is possible to provide the flexible display device 100 with reduced noise by minimizing a gap formed between the back cover 110 and the arm plate 120 when the curvature of the back cover 110 is changed.

Figure 9:
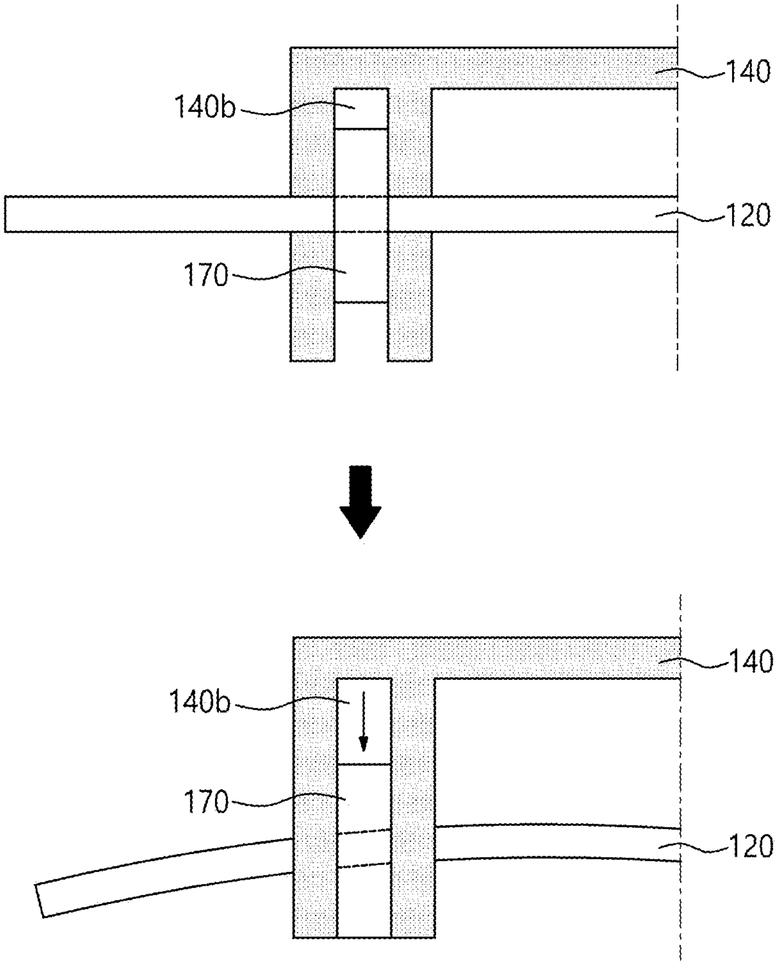
FIG. 9 is a view schematically illustrating an operation of a variable plate according to a curvature change of an arm plate according to an embodiment of the disclosure.

FIG. 9 is a view schematically illustrating an operation of a variable plate according to a curvature change of an arm plate according to an embodiment of the disclosure. The operation of the variable plate 170 is described below with reference to FIG. 9.

Referring to FIG. 9, when the arm plate 120 is set to the curved mode from the flat mode state, the curvature of the arm plate 120 can be changed by the driving assembly 130. As the curvature of the arm plate 120 is changed, the variable plate 170 connected to the arm plate 120 can move in the guide groove 140*b* of the cover part 140.

As described above, as the variable plate 170 linearly moves within the guide groove 140*b* of the cover 140, the gap formed between the back cover 110 and the arm plate 120 when the variable plate 170 is set to the curved mode can be minimized, thereby preventing noise from escaping between the back cover 110 and the arm plate 120.

Meanwhile, a width of the guide groove 140*b* can be larger than a width of the variable plate 170. This is because, when the width of the guide groove 140*b* is less than or equal to the width of the variable plate 170, the arm plate 120 can be bent or damaged due to insufficient moving space when the curvature of the arm plate 120 is changed.

According to the present embodiment, the flexible display device 100 can include a sealing member 180 coupled between the back cover 110 and the cover 140 and configured to shield noise generated from the driving assembly 130. For example, the sealing member 180 can be formed in a ring shape formed along the edge of the bracket 150 and can be formed of an elastic resin material.

Accordingly, when the cover 140 is coupled onto the back cover 110, the sealing member 180 can be compressed to seal more firmly between the cover 140 and the back cover 110. Accordingly, it is possible to enhance the noise shielding efficiency of the driving assembly 130 by blocking noise from escaping through the gap between the cover 140 and the back cover 110. Further, moisture or foreign substances can be prevented from entering into the gap between the cover 140 and the back cover 110, thereby enhancing the lifespan of the driving assembly 130.

In the sealing member 180, the anti-escape part 181 can protrude from a surface facing the cover part 140. For example, the anti-escape part 181 can be disposed on each of two opposite sides of the sealing member 180 to support the outer surface of the variable plate 170.

Accordingly, when the curvature of the arm plate 120 is changed, the variable plate 170 can linearly move in one direction along the anti-escape part 181. Further, as illustrated in FIG. 8, when the variable plate 170 moves from the back cover 110 to the cover 140 side, it can effectively block noise of the driving assembly 130 by covering a gap that can occur between the back cover 110 and the cover 140.

Figure 10:
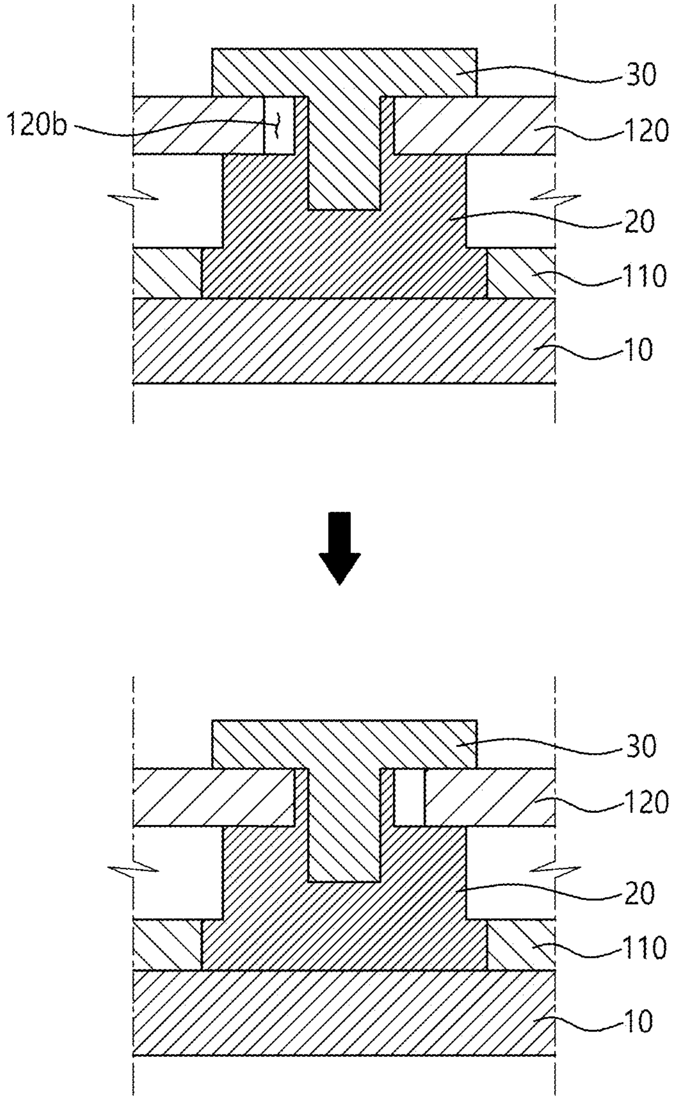
FIG. 10 is a view illustrating a slip occurring between an arm plate and a back cover.

FIG. 10 is a view illustrating a slip occurring between an arm plate and a back cover.

Referring to FIG. 10, an end portion of the arm plate 120 can be fixed to the back cover 110 by a fixing assembly including the nut member 20 and the bolt member 30. For example, after the arm plate 120 is interposed between the bolt member 30 and the nut member 20 fixed to the back cover 110, as the nut member 20 and the bolt member 30 are screwed, the arm plate 120 can be pressed and fixed on the back cover 110.

In this case, a fastening hole 120*b* into which the nut member 20 is inserted can be formed at an end portion of the arm plate 120. The fastening hole 120*b* can be formed to be larger than a width of the nut member 20 to facilitate assembly. In other words, when the nut member 20 is inserted into the fastening hole 120*b*, a free space is secured.

This free space can facilitate assembly, but can disadvantageously cause a left/right assembly deviation during assembly. The assembly deviation can cause a difference in time between when the fixing assembly is pushed and when the fixing assembly is pulled when the curvature of the arm plate 120 is changed, thereby causing the display panel 10 to shake at a time of on/off of the driving assembly 130.

Further, since the arm plate 120 is fixed to the back cover 110 only by pressing the nut member 20 and the bolt member 30, the arm plate 120 can move left and right, and slip when the curvature of the arm plate 120 is changed.

To solve or address this issue, the fixing assembly according to an embodiment of the disclosure can enhance the coupling force between the arm plate 120 and the back cover 110 through the nut member 20 formed of a PEM nut and the bolt member 30 formed of a SEMS screw. The fixing assembly including the nut member 20 and the bolt member 30 according to the present embodiment is described below with reference to FIGS. 11 to 13.

Figure 11:
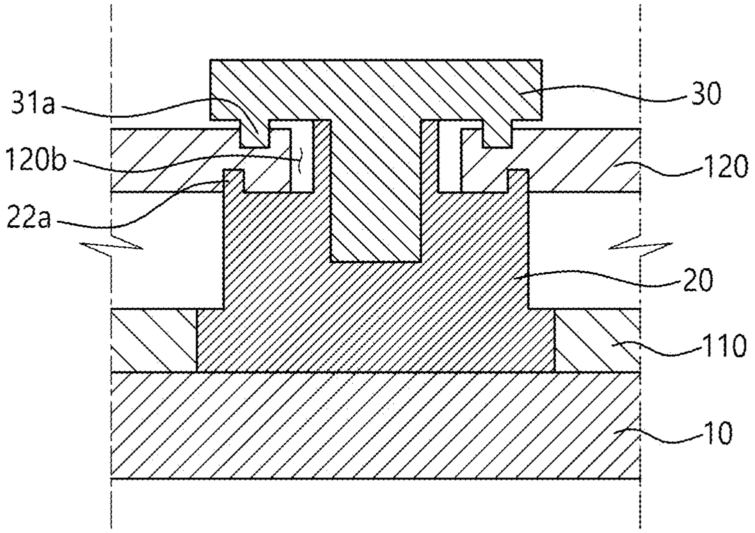
FIG. 11 is a cross-sectional view illustrating a fixing assembly according to an embodiment of the disclosure.

FIG. 11 is a cross-sectional view illustrating a fixing assembly according to an embodiment.

Referring to FIG. 11, end portions of the back cover 110 and the arm plate 120 can be coupled to each other by a fixing assembly including a nut member 20 and a bolt member 30.

The nut member 20 can be formed on the back cover 110. For example, the nut member 20 can support one surface of the arm plate 120, and a central portion of the nut member 20 can protrude to penetrate the arm plate 120. Accordingly, when the end portion of the arm plate 120 is seated on the nut member 20 and then the bolt member 30 is fastened to the nut member 20, the end portion of the arm plate 120 can be pressed by the bolt member 30 fastened to the nut member 20, and be fixed on the back cover 110.

Figure 12:
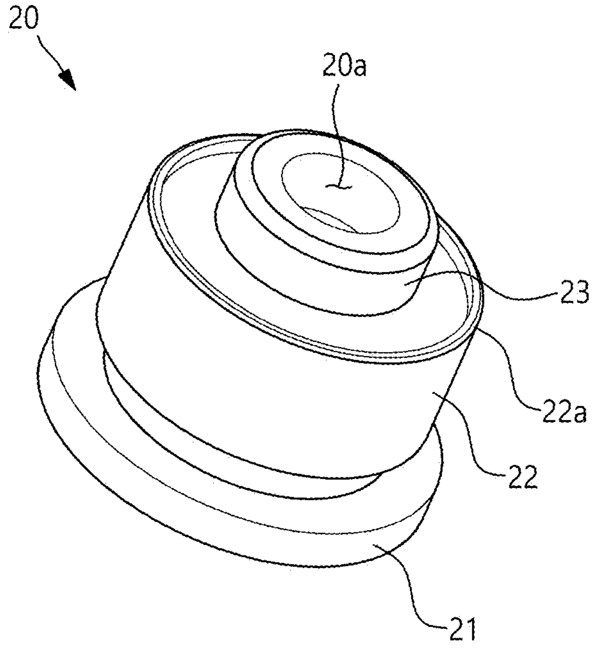
FIG. 12 is a perspective view illustrating a nut member constituting the fixing assembly of FIG. 11.

FIG. 12 is a perspective view illustrating a nut member constituting the fixing assembly of FIG. 11.

Referring to FIG. 12, the nut member 20 is a PEM nut having a threaded inner surface of the hollow thereof, and can include a base portion 21, a body portion 22, and a fastening portion 23.

The base portion 21 is a member fixed to the back cover 110, and can be coupled to the back cover 110 through an adhesive or can be formed as one body with the back cover 110. For example, the base portion 21 can be formed in a circular plate shape.

The body portion 22 can be formed to protrude from the base portion 21 in one direction to support the arm plate 120, and can have an anti-loose rib 22*a* formed on a support surface supporting the arm plate 120 and configured to be fixed while pressing and deforming the arm plate 120 when fastened to the bolt member 30.

For example, the anti-loose rib 22*a* can be formed to protrude along the outer circumference of the body portion 22. Due to the configuration of the anti-loose rib 22*a*, when fastened to the bolt member 30, the anti-loose rib 22*a* can press the arm plate 120 to form a pressing groove corresponding to the anti-loose rib 22*a* in a lower portion of the arm plate 120, and the anti-loose rib 22*a* can be engaged with the pressing groove to increase the coupling force between the nut member 20 and the arm plate 120.

As described above, as the coupling force between the fixing assembly and the arm plate 120 increases, it is possible to prevent a slip in which the end portion of the arm plate 120 escapes from the back cover 110 when the driving assembly 130 is operated.

The fastening portion 23 can protrude from the body portion 22 in one direction and pass through the arm plate 120, and can have a threaded inner circumferential surface to which the bolt member 30 is fastened. For example, the fastening portion 23 can be formed in a hollow cylindrical shape having a threaded inner circumferential surface. In order for the fastening portion 23 to pass through the arm plate 120, a fastening hole 120*b* having a shape corresponding to the outer circumferential surface of the fastening portion 23 can be formed at the end portion of the arm plate 120.

Figure 13:
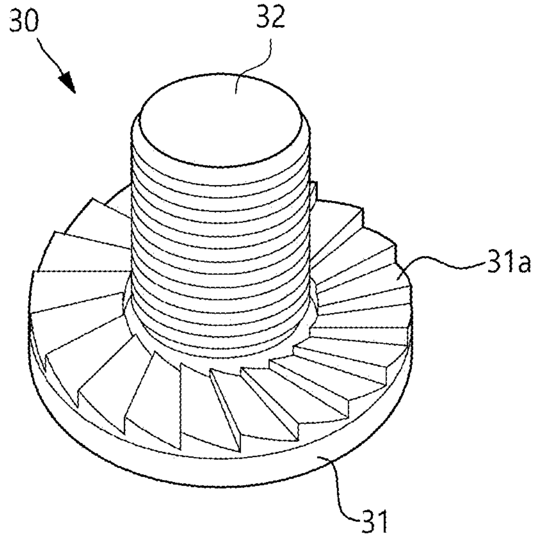
FIG. 13 is a perspective view illustrating a bolt member constituting the fixing assembly of FIG. 11.

FIG. 13 is a perspective view illustrating a bolt member constituting the fixing assembly of FIG. 11.

Referring to FIG. 13, the bolt member 30 can be a SEMS screw having a threaded outer circumferential surface, and can include a head portion 31 and a screw member 32.

The head portion 31 can have an anti-loose protrusion 31*a* fixed while pressing and deforming the arm plate 120 when fastened with the nut member 20, on the surface facing the arm plate 120. For example, the head portion 31 can be formed in a circular plate shape. The anti-loose protrusion 31*a* formed on the lower surface of the head portion 31 can be formed in a triangular bar shape having an inclined surface to have a pointed end portion. A plurality of anti-loose protrusions 31*a* can be provided along the circumference of the head portion 31 with respect to the screw member 32.

Due to the configuration of the anti-loose protrusion 31*a*, when fastened to the nut member 20, the anti-loose protrusion 31*a* can press the arm plate 120 to form a pressing groove corresponding to the anti-loose protrusion 31*a* in an upper portion of the arm plate 120, and the anti-loose protrusion 31*a* can be engaged with the pressing groove to increase the coupling force between the nut member 20 and the arm plate 120. In other words, a slip can be prevented from occurring under the arm plate 120 through the anti-loose rib 22*a* of the nut member 20 described above, and a slip can be prevented from occurring over the arm plate 120 through the anti-loose protrusion 31*a*.

The screw member 32 can protrude from one surface of the head portion 31 where the anti-loose protrusion 31*a* is formed, and can have a threaded outer circumferential surface. Accordingly, when the screw member 32 of the bolt member 30 is coupled to the fastening portion 23 of the nut member 20, the arm plate 120 disposed between the nut member 20 and the bolt member 30 can be pressed and deformed and firmly fixed on the back cover 110.

Embodiments of the disclosure described above are briefly described below.

According to embodiments of the disclosure, there can be provided a flexible display device comprising a back cover supporting a rear surface of a display panel, a pair of arm plates disposed to face each other and having a portion of an end portion thereof fixed to the back cover, a driving assembly connected between the pair of arm plates, and sliding the arm plate in a length direction to change a curvature of the back cover and the display panel, and a cover part disposed on a rear surface of the back cover and covering the driving assembly to shield noise generated from the driving assembly.

According to embodiments of the disclosure, a plurality of coupling protrusions can be provided on the rear surface of the back cover, and a coupling hole into which the coupling protrusion is inserted can be provided in the cover part.

According to embodiments of the disclosure, the cover part can further include a rib formed to protrude from an inner surface of the cover part to surround a lower portion of the driving assembly.

According to embodiments of the disclosure, the display device can further comprise a variable plate supporting an inner portion of the arm plate and formed to be linearly movable in a direction perpendicular to a moving direction of the arm plate in the cover part.

According to embodiments of the disclosure, the cover part can have a guide groove formed in a surface facing the back cover and recessed in a direction perpendicular to the moving direction of the arm plate, and the variable plate can linearly move in the guide groove when the curvature of the back cover is changed.

According to embodiments of the disclosure, a width of the guide groove can be larger than a width of the variable plate.

According to embodiments of the disclosure, the variable plate can include a through hole through which the arm plate passes.

According to embodiments of the disclosure, the flexible display device can further comprise a sealing member coupled between the back cover and the cover part to shield noise generated from the driving assembly.

According to embodiments of the disclosure, the sealing member can have an anti-escape part formed to protrude from a surface facing the cover part to support an outer surface of the variable plate to prevent the variable plate from escaping off.

According to embodiments of the disclosure, the flexible display device can further comprise a bracket having one surface detachably fixed to the rear surface of the back cover and another surface to which the driving assembly is coupled.

According to embodiments of the disclosure, the driving assembly can include a wheel member rotatably connected to the back cover, a pinion gear fixed to a rotating shaft of the wheel member to interlock with the wheel member, a first rack gear having one surface fixed to one of the arm plates and a lower portion engaged with one side of the pinion gear to linearly move when the pinion gear rotates, and a second rack gear having one surface fixed to a rest of the arm plate and an upper portion engaged with another side of the pinion gear to linearly move in a direction opposite to that of the first rack gear when the pinion gear rotates.

According to embodiments of the disclosure, the wheel member can be provided as a worm wheel gear. The flexible display device can further comprise a power transmission unit connected to the worm wheel gear to rotate the worm wheel member, on the rear surface of the back cover.

According to embodiments of the disclosure, the power transmission unit can include a rotary actuator rotatably coupled to the rear surface of the back cover, a first connecting gear coupled to a rotating shaft of the rotating actuator, a second connecting gear engaged with the first connecting gear to rotate in conjunction with the first connecting gear, and a worm gear having a rotating shaft coupled with the second connecting gear and a worm formed on an outer circumferential surface thereof to be engaged with the worm wheel member to receive power from the rotary actuator to rotate the worm wheel member.

According to embodiments of the disclosure, the flexible display device can further comprise a rotary actuator cover part covering the rotary actuator to shield noise generated from the rotary actuator.

According to embodiments of the disclosure, the arm plate can include a plurality of guide holes elongated in a length direction. The back cover can include a plurality of guide members protruding from the rear surface and moving along the guide hole.

According to embodiments of the disclosure, the back cover can include a nut member supporting one surface of the arm plate, and having a central portion protruding to penetrate the arm plate. The arm plate can be pressed by a bolt member fastened with the nut member and can be fixed on the back cover.

According to embodiments of the disclosure, the nut member can include a base portion fixed to the back cover, a body portion formed to protrude from the base portion in one direction to support the arm plate, and having an anti-loose rib fixed to press and deform the arm plate when fastened with the bolt member, on a support surface supporting the arm plate, and a fastening portion protruding from the body portion in one direction to penetrate the arm plate, and having a threaded inner circumferential surface fastened with the bolt member.

According to embodiments of the disclosure, the anti-loose rib can be formed to protrude along an outer circumference of the body portion.

According to embodiments of the disclosure, the bolt member can include a head portion having an anti-loose protrusion fixed while pressing and deforming the arm plate when fastened with the nut member, on a surface facing the arm plate, and a screw member formed to protrude from one surface of the head portion with the anti-loose protrusion, and having a threaded outer circumferential surface.

According to embodiments of the disclosure, the anti-loose protrusion can be formed in a triangular bar shape having an inclined surface and can have a pointed end. A plurality of anti-loose protrusions can be arranged along a circumference of the head portion with respect to the screw member.

According to embodiments of the disclosure, the curvature of the back cover and the display panel may vary according to a length of the guide hole.

According to embodiments of the disclosure, the bracket may include a guide protrusion, and the wheel member of the driving assembly may include an arc-shaped guide slot, and when the guide protrusion is inserted into the guide slot, the wheel member may rotate along the guide slot while being supported by the guide protrusion.

According to embodiments of the disclosure, when the display panel is set to the curved mode, the variable plate may linearly move to block a gap formed between the back cover and the arm plate.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A flexible display device, comprising:

a back cover configured to support a rear surface of a display panel;

a pair of arm plates disposed to face each other and having a portion of an end portion thereof fixed to the back cover;

a driving assembly connected between the pair of arm plates, and configured to slide an arm plate of the pair of arm plates in a length direction to change a curvature of the back cover and the display panel;

a cover part disposed on a rear surface of the back cover and configured to cover the driving assembly to shield noise generated from the driving assembly; and a variable plate configured to support an inner portion of the arm plate and being linearly movable in a direction perpendicular to a moving direction of the arm plate in the cover part.

2. The flexible display device of claim 1, wherein a plurality of coupling protrusions are provided on the rear surface of the back cover, and wherein a coupling hole into which one of the plurality of coupling protrusions is inserted is provided in the cover part.

3. The flexible display device of claim 1, wherein the cover part includes a rib disposed to protrude from an inner surface of the cover part and configured to surround a lower portion of the driving assembly.

4. The flexible display device of claim 1, wherein the cover part has a guide groove disposed in a surface facing the back cover and recessed in the direction perpendicular to the moving direction of the arm plate, and wherein the variable plate linearly moves in the guide groove when the curvature of the back cover is changed.

5. The flexible display device of claim 4, wherein when the display panel is set to a curved mode, the variable plate linearly moves to block a gap formed between the back cover and the arm plate.

6. The flexible display device of claim 1, wherein a width of a guide groove is larger than a width of the variable plate.

7. The flexible display device of claim 1 wherein the variable plate includes a through hole through which the arm plate passes.

8. The flexible display device of claim 1, further comprising a sealing member coupled between the back cover and the cover part to shield noise generated from the driving assembly.

9. The flexible display device of claim 8, wherein the sealing member has an anti-escape part disposed to protrude from a surface facing the cover part to support an outer surface of the variable plate to prevent the variable plate from dislocating.

10. The flexible display device of claim 1, further comprising a bracket having one surface detachably fixed to the rear surface of the back cover and another surface to which the driving assembly is coupled.

11. The flexible display device of claim 1, wherein the driving assembly includes:

a wheel member rotatably connected to the back cover;

a pinion gear fixed to a rotating shaft of the wheel member to interlock with the wheel member;

a first rack gear having one surface fixed to one of the pair of arm plates and a lower portion engaged with one side of the pinion gear to linearly move when the pinion gear rotates; and a second rack gear having one surface fixed to another of the pair of arm plates and an upper portion engaged with another side of the pinion gear to linearly move in a direction opposite to that of the first rack gear when the pinion gear rotates.

12. The flexible display device of claim 11, wherein the wheel member is provided as a worm wheel gear, and wherein the flexible display device further comprises a power transmission unit connected to the worm wheel gear to rotate a worm wheel member, on the rear surface of the back cover.

13. The flexible display device of claim 1, wherein the arm plate includes a plurality of guide holes elongated in the length direction, and wherein the back cover includes a plurality of guide members protruding from the rear surface that are configured to move along at least one of the plurality of guide holes.

14. The flexible display device of claim 13, wherein the curvature of the back cover and the display panel varies according to a length of a guide hole of the plurality of guide holes.

15. A flexible display device, comprising:

a back cover configured to support a rear surface of a display panel;

a pair of arm plates disposed to face each other and having a portion of an end portion thereof fixed to the back cover;

a driving assembly connected between the pair of arm plates, and configured to slide an arm plate of the pair of arm plates in a length direction to change a curvature of the back cover and the display panel;

a cover part disposed on a rear surface of the back cover and configured to cover the driving assembly to shield noise generated from the driving assembly; and a power transmission unit, wherein the driving assembly includes:

a wheel member rotatably connected to the back cover;

a pinion gear fixed to a rotating shaft of the wheel member to interlock with the wheel member;

a first rack gear having one surface fixed to one of the pair of arm plates and a lower portion engaged with one side of the pinion gear to linearly move when the pinion gear rotates; and a second rack gear having one surface fixed to another of the pair of arm plates and an upper portion engaged with another side of the pinion gear to linearly move in a direction opposite to that of the first rack gear when the pinion gear rotates, wherein the wheel member is provided as a worm wheel gear, wherein the power transmission unit is connected to the worm wheel gear to rotate a worm wheel member, on the rear surface of the back cover, and wherein the power transmission unit includes:

a rotary actuator rotatably coupled to the rear surface of the back cover;

a first connecting gear coupled to a rotating shaft of the rotary actuator;

a second connecting gear engaged with the first connecting gear to rotate in conjunction with the first connecting gear; and a worm gear having a rotating shaft coupled with the second connecting gear and a worm disposed on an outer circumferential surface thereof to be engaged with the worm wheel member to receive power from the rotary actuator to rotate the worm wheel member.

16. The flexible display device of claim 15, further comprising a rotary actuator cover part configured to cover the rotary actuator to shield noise generated from the rotary actuator.

17. A flexible display device, comprising:

a back cover configured to support a rear surface of a display panel;

a pair of arm plates disposed to face each other and having a portion of an end portion thereof fixed to the back cover;

a driving assembly connected between the pair of arm plates, and configured to slide an arm plate of the pair of arm plates in a length direction to change a curvature of the back cover and the display panel; and a cover part disposed on a rear surface of the back cover and configured to cover the driving assembly to shield noise generated from the driving assembly, wherein the back cover includes a nut member configured to support one surface of the arm plate, and having a central portion protruding to penetrate the arm plate, and wherein the arm plate is pressed by a bolt member fastened with the nut member and is fixed on the back cover.

18. The flexible display device of claim 17, wherein the nut member includes:

a base portion fixed to the back cover;

a body portion disposed to protrude from the base portion in one direction to support the arm plate, and having an anti-loose rib fixed to press and deform the arm plate when fastened with the bolt member, the anti-loose rib being disposed on a support surface supporting the arm plate; and a fastening portion protruding from the body portion in one direction to penetrate the arm plate, and having a threaded inner circumferential surface fastened with the bolt member.

19. The flexible display device of claim 18, wherein the anti-loose rib is disposed to protrude along an outer circumference of the body portion.

20. The flexible display device of claim 17, wherein the bolt member includes:

a head portion having an anti-loose protrusion fixed while pressing and deforming the arm plate when fastened with the nut member, and disposed on a surface facing the arm plate; and a screw member disposed to protrude from one surface of the head portion with the anti-loose protrusion, and having a threaded outer circumferential surface.

21. The flexible display device of claim 20, wherein the anti-loose protrusion is formed in a triangular bar shape having an inclined surface and has a pointed end, and wherein a plurality of anti-loose protrusions are arranged along a circumference of the head portion with respect to the screw member.

22. A flexible display device, comprising:

a back cover configured to support a rear surface of a display panel;

a pair of arm plates disposed to face each other and having a portion of an end portion thereof fixed to the back cover;

a driving assembly connected between the pair of arm plates, and configured to slide an arm plate of the pair of arm plates in a length direction to change a curvature of the back cover and the display panel;

a cover part disposed on a rear surface of the back cover and configured to cover the driving assembly to shield noise generated from the driving assembly; and a bracket having one surface detachably fixed to the rear surface of the back cover and another surface to which the driving assembly is coupled, wherein the bracket includes a guide protrusion, and a wheel member of the driving assembly includes an arc-shaped guide slot, and wherein when the guide protrusion is inserted into the guide slot, the wheel member rotates along the guide slot while being supported by the guide protrusion.

* * * * *